United States Patent
Kinsley

(10) Patent No.: US 8,124,456 B2
(45) Date of Patent: Feb. 28, 2012

(54) METHODS FOR SECURING SEMICONDUCTOR DEVICES USING ELONGATED FASTENERS

(75) Inventor: Thomas H. Kinsley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 85 days.

(21) Appl. No.: 12/684,646

(22) Filed: Jan. 8, 2010

(65) Prior Publication Data
US 2010/0112754 A1    May 6, 2010

Related U.S. Application Data

(62) Division of application No. 11/369,571, filed on Mar. 7, 2006, now Pat. No. 7,663,232.

(51) Int. Cl.
*H01L 21/00* (2006.01)

(52) U.S. Cl. ........ 438/117; 438/107; 438/109; 438/110; 257/E25.017; 257/686; 257/777

(58) Field of Classification Search ........... 257/E25.017, 257/E23.078, E25.013, E25.597, E23.011, 257/618, 620, 621, 685, 686, 668, 673, 679, 257/723, 726, 777, 797; 438/106, 109, 125, 438/126, 107, 110, 117
See application file for complete search history.

(56) References Cited

U.S. PATENT DOCUMENTS

| | | | |
|---|---|---|---|
| 3,459,998 A | 8/1969 | Focarile | |
| 3,904,934 A | 9/1975 | Martin | |
| 4,225,900 A * | 9/1980 | Ciccio et al. | 361/739 |
| 4,601,526 A | 7/1986 | White et al. | |
| 5,012,323 A | 4/1991 | Farnworth | |
| 5,128,831 A | 7/1992 | Fox, III et al. | |
| 5,165,984 A | 11/1992 | Schoenthaler | |
| 5,241,454 A | 8/1993 | Ameen et al. | |
| 5,291,061 A | 3/1994 | Ball | |
| 5,323,060 A | 6/1994 | Fogal et al. | |
| 5,399,898 A | 3/1995 | Rostoker | |
| 5,594,275 A | 1/1997 | Kwon et al. | |
| 5,608,262 A | 3/1997 | Degani et al. | |
| 5,781,415 A | 7/1998 | Itoh | |
| 5,783,870 A | 7/1998 | Mostafazadeh et al. | |
| 5,917,242 A | 6/1999 | Ball | |
| 5,923,090 A | 7/1999 | Fallon et al. | |
| 5,952,725 A | 9/1999 | Ball | |
| 6,020,629 A | 2/2000 | Farnworth et al. | |
| 6,023,097 A | 2/2000 | Chiang et al. | |
| 6,051,878 A | 4/2000 | Akram et al. | |
| 6,051,886 A | 4/2000 | Fogal et al. | |
| 6,084,308 A | 7/2000 | Kelkar et al. | |
| 6,165,815 A | 12/2000 | Ball | |
| 6,212,767 B1 | 4/2001 | Tandy | |
| 6,252,305 B1 | 6/2001 | Lin et al. | |

(Continued)

*Primary Examiner* — Chris Chu
(74) *Attorney, Agent, or Firm* — TraskBritt

(57) ABSTRACT

Semiconductor device assemblies include elements such as electronic components and substrates secured together by a fastener that includes an elongated portion extending continuously through an aperture in two or more such elements. Computer systems include such semiconductor device assemblies. Fasteners for securing together such elements include an elongated portion, a first end piece, and a second end piece. Methods of securing together a plurality of semiconductor devices include inserting an elongated portion of a fastener through an aperture in a first semiconductor device and an aperture in at least one additional semiconductor device. Circuit boards include a plurality of apertures disposed in an array corresponding to an array of apertures in a semiconductor device assembly. Each aperture is sized and configured to receive a fastener for maintaining an assembled relationship between the semiconductor device assembly and the circuit board.

13 Claims, 9 Drawing Sheets

U.S. PATENT DOCUMENTS

| | | |
|---|---|---|
| 6,271,056 B1 | 8/2001 | Farnworth et al. |
| 6,303,981 B1 | 10/2001 | Moden |
| 6,333,563 B1 | 12/2001 | Jackson et al. |
| 6,404,044 B2 | 6/2002 | Akram et al. |
| 6,410,431 B2 | 6/2002 | Bertin et al. |
| 6,413,797 B2 | 7/2002 | Oka et al. |
| 6,499,213 B2 | 12/2002 | Tandy |
| 6,504,253 B2 | 1/2003 | Mastromatteo et al. |
| 6,525,413 B1 | 2/2003 | Cloud et al. |
| 6,552,910 B1 | 4/2003 | Moon et al. |
| 6,553,658 B2 | 4/2003 | Tandy |
| 6,577,013 B1 * | 6/2003 | Glenn et al. ............... 257/777 |
| 6,583,502 B2 | 6/2003 | Lee et al. |
| 6,583,503 B2 | 6/2003 | Akram et al. |
| 6,586,826 B1 | 7/2003 | Glenn et al. |
| 6,593,662 B1 | 7/2003 | Pu et al. |
| 6,664,616 B2 | 12/2003 | Tsubosaki et al. |
| 6,677,664 B2 | 1/2004 | Inoue et al. |
| 6,682,955 B2 | 1/2004 | Cobbley et al. |
| 6,700,206 B2 | 3/2004 | Kinsman |
| 6,706,557 B2 | 3/2004 | Koopmans |
| 6,716,672 B2 | 4/2004 | Val |
| 6,727,116 B2 | 4/2004 | Poo et al. |
| 6,756,305 B1 | 6/2004 | Conn |
| 6,760,224 B2 | 7/2004 | Moden et al. |
| 6,787,917 B2 | 9/2004 | Lee et al. |
| 6,798,057 B2 | 9/2004 | Bolkin et al. |
| 6,833,613 B1 | 12/2004 | Akram |
| 6,841,863 B2 | 1/2005 | Baik et al. |
| 6,847,105 B2 | 1/2005 | Koopmans |
| 6,887,769 B2 | 5/2005 | Kellar et al. |
| 6,906,416 B2 | 6/2005 | Karnezos |
| 6,908,785 B2 * | 6/2005 | Kim ............................ 438/106 |
| 7,091,592 B2 | 8/2006 | Chen et al. |
| 7,663,232 B2 * | 2/2010 | Kinsley ...................... 257/726 |
| 2003/0094707 A1 | 5/2003 | Howarth |
| 2003/0162325 A1 | 8/2003 | Tan et al. |
| 2003/0207515 A1 | 11/2003 | Tan et al. |
| 2003/0207516 A1 | 11/2003 | Tan et al. |
| 2004/0115863 A1 | 6/2004 | Oyama |
| 2007/0210447 A1 | 9/2007 | Kinsley |

* cited by examiner

METHODS FOR SECURING SEMICONDUCTOR DEVICES USING ELONGATED FASTENERS

CROSS-REFERENCE TO RELATED APPLICATION

This application is a divisional of U.S. patent application Ser. No. 11/369,571, filed Mar. 7, 2006, now U.S. Pat. No. 7,663,232, issued Feb. 16, 2010, the disclosure of which is hereby incorporated herein by this reference in its entirety.

BACKGROUND OF THE INVENTION

1. Field of the Invention

The present invention relates generally to elements for securing electronic components to one another and, more particularly, to fasteners that extend through apertures in two or more electronic components and that are configured to maintain an assembled relationship between the electronic components. The present invention also relates to methods for attaching semiconductor devices together, methods for attaching semiconductor devices to substrates, and methods for establishing electrical communication between semiconductor devices and substrates using fasteners.

2. Discussion of Related Art

In the field of electronic devices, individual elements or components are both structurally and electrically assembled. For example, in a computer system, a memory module may be electrically and structurally coupled to a motherboard. The memory module itself may include a semiconductor device package that is both electrically and structurally coupled to a circuit board. Even the semiconductor device package of the memory module may include two or more semiconductor dice that are both electrically and structurally coupled to one another. Such semiconductor device packages that include two or more semiconductor dice are commonly referred to as multi-chip modules ("MCM").

MCM designs often include two or more semiconductor device packages or substantially bare semiconductor dice stacked vertically on top of one another, the stack being attached to a circuit board. Electrical communication between the integrated circuit contained within each semiconductor device package or semiconductor die and the underlying circuit board typically is established by way of conductive leads, bond wires, or other conductive structures. The conductive leads, bond wires, conductive traces carried by a flexible dielectric substrate (such as those used in conventional tape-automated bonding (TAB) processes) or other conductive structures typically are routed in a lateral direction from a surface of the semiconductor device package or semiconductor die beyond a lateral surface thereof and down to a surface of the circuit board.

The individual packages or dice in the MCM generally are structurally coupled to one another using an adhesive material such as, for example, epoxy applied therebetween. Alternatively, dual sided adhesive tape may be used to structurally couple the individual semiconductor device packages or semiconductor dice to one another.

Several drawbacks exist with conventional MCM designs. First, the methods in which the individual packages or dice are structurally coupled together do not facilitate rework procedures. For example, if an individual package or die in an MCM is found to be defective during testing after fabrication thereof, scrapping of the entire MCM may be required due to permanent adhesive bonds between the defective package or die and the adjacent components of the module. Second, many conventional MCM designs require that electrically conductive structures or materials be provided laterally alongside each individual package or die in the MCM, which requires that the MCM module occupy a larger surface area on a higher level substrate to which the MCM module is attached, such as a circuit board.

Therefore, it would be advantageous to develop a method for securing two or more elements or components of an electronic device to one another to form an assembly that facilitates replacement or re-working of the assembly during fabrication thereof, and that allows for increased density.

BRIEF SUMMARY OF THE INVENTION

In one aspect, the present invention includes a semiconductor device assembly that includes a first electronic component and at least one additional electronic component at least partially secured together by at least one fastener. The at least one fastener includes an elongated portion that extends continuously through an aperture extending through the first electronic component and an aperture extending through the second electronic component.

In another aspect, the present invention includes at least one electronic component and an assembly substrate that are at least partially secured together by at least one fastener. The at least one fastener includes an elongated portion that extends continuously through an aperture that extends through the electronic component and an aperture that extends through the assembly substrate.

In still another aspect, the present invention includes a computer system that includes an electronic signal processor in communication with at least one input device and at least one output device, and an electronic device assembly. The electronic device assembly includes at least one electronic component and an assembly substrate that are at least partially secured together by at least one fastener. The at least one fastener includes an elongated portion that extends continuously through an aperture that extends through the electronic component and an aperture that extends through the assembly substrate.

In another aspect, the present invention includes a method of securing together a plurality of semiconductor devices. A first semiconductor device is provided that includes at least one aperture extending therethrough. At least one additional semiconductor device is provided that includes at least one aperture extending therethrough. A fastener is provided that includes an elongated portion, and the elongated portion is inserted through the at least one aperture that extends through the first semiconductor device and the at least one aperture that extends through the additional semiconductor device to at least partially secure together the first semiconductor device and the additional semiconductor device.

In yet another aspect, the present invention includes a fastener for securing together a semiconductor device having an aperture extending therethrough and at least one of an additional semiconductor device and a substrate. The fastener includes an elongated portion sized and configured to pass through an aperture extending through a semiconductor device, a first end piece, and a second end piece. The first end piece and the second end piece are sized and configured to prevent passage thereof through the aperture extending through the semiconductor device.

In still another aspect, the present invention includes a circuit board comprising a region configured for attachment to a semiconductor device assembly. The region includes a plurality of electrically conductive structures that are configured to make electrical contact with electrically conductive structures disposed on the semiconductor device assembly. The region also includes a plurality of apertures that extend through the circuit board. The apertures are disposed in an array corresponding to an array of apertures extending through the semiconductor device assembly. Each aperture is sized and configured to receive a fastener for maintaining an assembled relationship between the semiconductor device assembly and the circuit board.

The features, advantages, and alternative aspects of the present invention will be apparent to those skilled in the art from a consideration of the following detailed description taken in combination with the accompanying drawings.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENTS

Figure 1A:
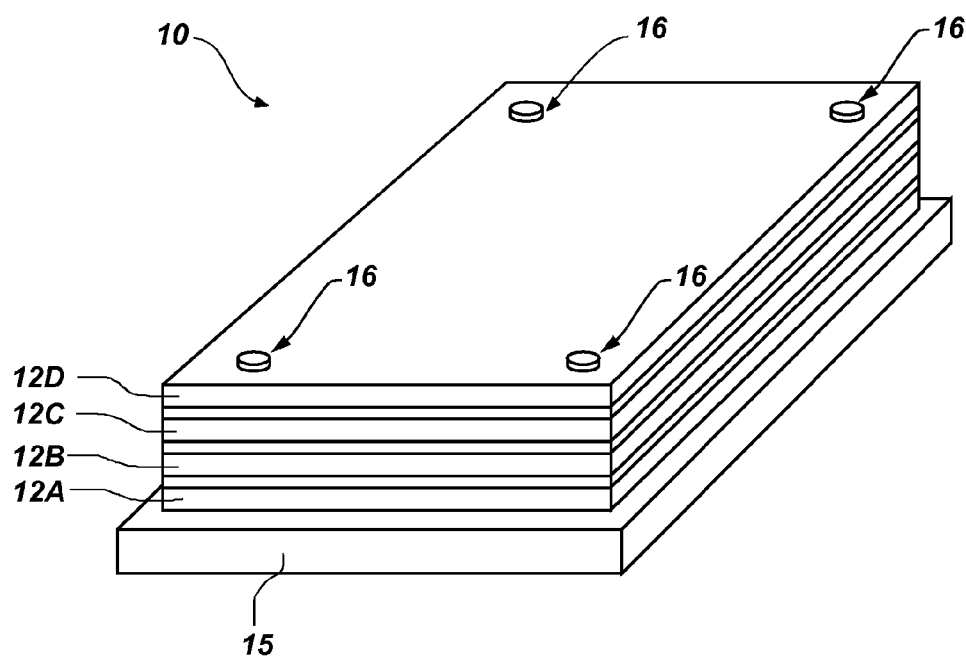
FIG. 1A is a perspective view of an illustrative semiconductor device assembly that includes a plurality of dielectric fasteners according to teachings of the present invention.

In the description which follows, like features and elements may be identified by the same or similar reference numerals for ease of identification and enhanced understanding of the disclosure hereof. Such identification is by way of convenience for the reader only, however, and is not limiting of the present invention or an implication that features and elements of various components and embodiments identified by like reference numerals are identical or constrained to identical functions.

Figure 1B:
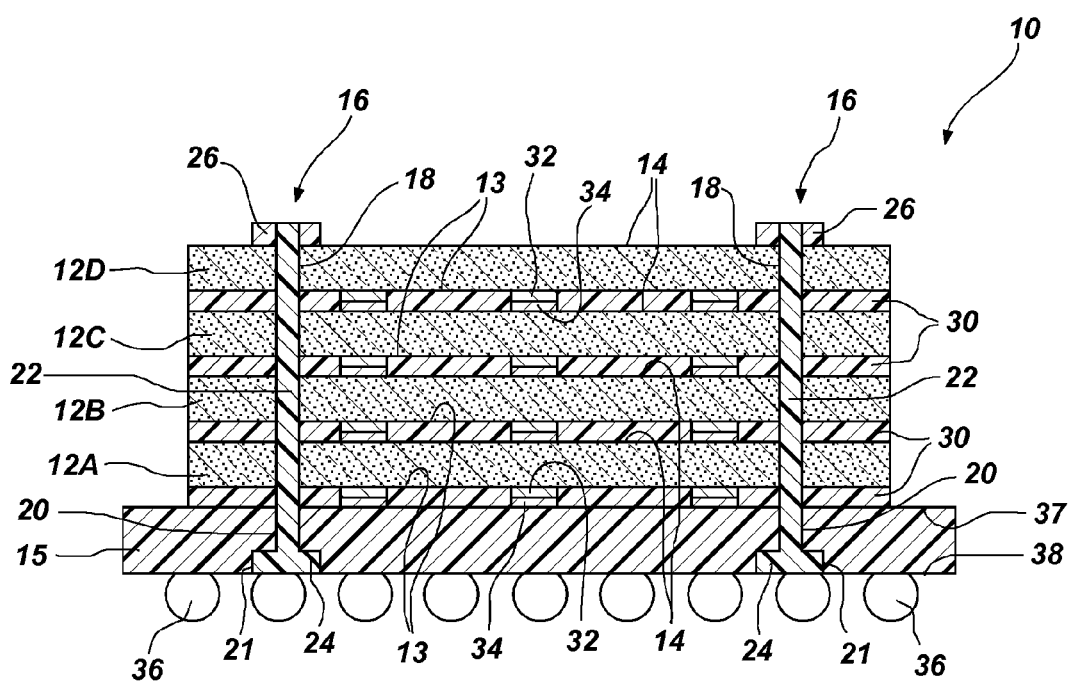
FIG. 1B is a cross-sectional side view of the semiconductor device assembly shown in FIG. 1A.

An illustrative semiconductor device assembly 10 that embodies teachings of the present invention is shown in FIGS. 1A and 1B. In the embodiment shown therein, the semiconductor device assembly 10 includes a multi-chip module (MCM) having a first electronic component 12A, a second electronic component 12B, a third electronic component 12C, and a fourth electronic component 12D. By way of example and not limitation, each of the electronic components 12A, 12B, 12C, 12D may include a semiconductor device package, a semiconductor die, or any other electronic device component.

The electronic components 12A, 12B, 12C, 12D may be stacked on and secured to an assembly substrate 15. By way of example and not limitation, the assembly substrate 15 may include a circuit board, an interposer, a semiconductor die, a semiconductor device package, or any other substrate.

The semiconductor device assembly 10 may further include a plurality of fasteners 16. The fasteners 16 may at least partially structurally couple and secure together at least some of the electronic components 12A-12D and the assembly substrate 15.

In additional embodiments, the semiconductor device assembly 10 may include only one electronic component secured to the assembly substrate 15, or the semiconductor device assembly 10 may include two or more electronic components secured together without including the assembly substrate 15. Furthermore, the semiconductor device assembly 10 may include more than four electronic components secured to the assembly substrate 15.

Referring to FIG. 1B, by way of example and not limitation, each electronic component 12A-12D may have at least one aperture 18 extending therethrough configured to receive at least a portion of a fastener 16. For example, each electronic component 12A-12D may have at least one aperture 18 extending therethrough for every fastener 16 of the semiconductor device assembly 10. The assembly substrate 15 may also have at least one aperture 20 extending therethrough for every fastener 16 of the semiconductor device assembly 10. Each aperture 18 and each aperture 20 may have a size and shape configured to receive at least a portion of a fastener 16.

By way of example and not limitation, each aperture 18 and each aperture 20 may have a cross-sectional shape that is one of circular, triangular, rectangular, pentagonal, hexagonal, etc. In variations of the present invention, each fastener 16 may not extend through the entire semiconductor device assembly 10 including the assembly substrate 15 and each electronic component 12A-12D. At least some fasteners 16 may extend only partially through the semiconductor device assembly 10 and, as such, one or more of the assembly substrate 15 and each of the electronic components 12A-12D may not have an aperture 20 for every fastener 16.

Optionally, a dielectric underfill material 30 may be provided between adjacent electronic components 12A-12D, and between the first electronic component 12A and the assembly substrate 15. The dielectric underfill material 30 may be used to impart structural rigidity to the semiconductor device assembly 10, and/or to electrically isolate electrically conductive structures positioned between the adjacent electronic components 12A-12D, and between the first electronic component 12A and the assembly substrate 15. The dielectric underfill material 30 may include, for example, a silicone or silicone-based material, an epoxy or epoxy-based material, a dielectric tape or film, a pressure sensitive or reversible adhesive material, or any other electrically insulating material. By way of example and not limitation, the dielectric underfill material 30 may include a dielectric tape or film, which may be unsecured to the adjacent electronic components 12A-12D and/or the assembly substrate 15 to facilitate removal, rework, or repair of the semiconductor device assembly 10 as necessary. Such a dielectric tape or film may include apertures extending therethrough as necessary to accommodate each fastener 16. Furthermore, such dielectric tape or film may conform to and/or seal against surfaces of the adjacent electronic components 12A-12D and/or the assembly substrate 15.

If each electronic component 12A-12D includes a semiconductor die, each electronic component 12A-12D may include an active surface 13 on or in which the integrated circuit of the respective semiconductor die is formed. In the embodiment shown in FIG. 1B, the active surface 13 of each electronic component 12A-12D faces downward. In additional embodiments, the active surface 13 of each of the electronic components 12A-12D may face upward, or the active surfaces 13 of some electronic components 12A-12D may face upward, while the active surfaces 13 of other electronic components 12A-12D face downward.

Optionally, electrical contact and communication may be provided between at least some of the electronic components 12A-12D and the assembly substrate 15. Each electronic component 12A-12D may include electrical contacts on at least one surface thereof that are arranged in an array. By way of example and not limitation, a plurality of conductive structures 32 such as, for example, bond pads and/or conductive solder balls, bumps, or posts may be disposed in a selected electrical connection pattern on or in the active surface 13 of each electronic component 12A-12D.

For example, the conductive structures 32 may be arranged in a ball-grid-array (BGA) pattern. A plurality of conductive structures 34 such as, for example, conductive lands may be provided on or in a back surface 14 of each electronic component 12A-12D and on a surface of the assembly substrate 15. Each electronic component 12A-12D and the assembly substrate 15 may further include generally horizontally extending conductive traces (not shown) and generally vertically extending conductive vias (not shown) for providing electrical communication between the electrical components of the integrated circuits (not shown) of each electronic component 12A-12D and electrically conductive structures 36 on or in the assembly substrate 15, through the conductive structures 32 and the conductive structures 34.

In additional embodiments, an anisotropically conductive film, which includes a dielectric film with conductive elements extending through a thickness thereof and is typically referred to as a "z-axis conductive film," may be provided between adjacent electronic components 12A-12D and between the first electronic component 12A and the assembly substrate 15 to provide electrical communication between conductive structures 32 formed on or in the active surface 13 of an electronic component 12B, 12C, 12D and conductive structures 34 formed on or in the back surface 14 of an adjacent electronic component 12A, 12B, 12C, 12D, and between conductive structures 32 formed on or in the active surface 13 of the first electronic component 12A and conductive structures 34 formed on or in the surface of the assembly substrate 15.

As previously mentioned, generally horizontally extending conductive traces (not shown) and generally vertically extending conductive vias (not shown) may be provided on or in the assembly substrate 15 for providing electrical communication between the conductive structures 34, which may be provided on a first surface 37 thereof, and conductive structures 36, which may be provided on a second, opposite surface 38 thereof and configured for electrically coupling the semiconductor device assembly 10 to a higher level substrate such as, for example, a printed circuit board (not shown).

An encapsulant material (not shown in FIGS. 1A and 1B) may optionally be provided over the electronic components 12A-12D of the semiconductor device assembly 10 to provide structural rigidity and to provide protection to the electronic components 12A-12D from moisture, contaminants, static electricity, etc.

Figure 2:
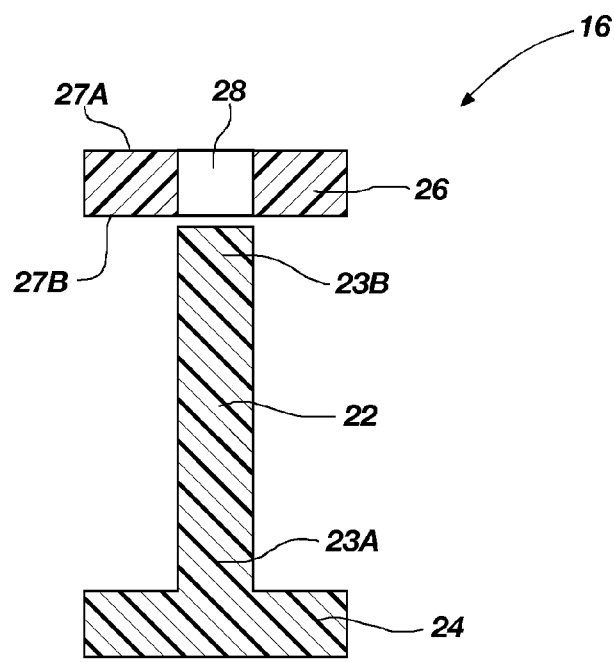
FIG. 2 is a cross-sectional side view of a fastener that may be used in the semiconductor device assembly shown in FIGS. 1A and 1B.

As best seen in FIG. 2, each fastener 16 may include an elongated portion 22 that is configured to extend continuously through at least a portion of an aperture 18 extending through one or more of the electronic components 12A-12D, and through at least a portion of an aperture 20 extending through the assembly substrate 15. The elongated portion 22 may have a size and shape configured to facilitate insertion of the elongated portion 22 into and through at least two components selected from the plurality of electronic components 12A-12D and the assembly substrate 15. The elongated portion 22 may include a unitary body formed of material without joints or seams. By way of example and not limitation, the elongated portion 22 of each fastener 16 may be configured as a substantially cylindrical rod. In other embodiments, the cross-sectional shape of the elongated portion 22 may be triangular, rectangular, pentagonal, hexagonal, etc. Furthermore, the elongated portion 22 may have a cross-sectional dimension that is less than about 50 microns. The elongated portion 22 of each fastener 16 may be electrically non-conductive, and may include, for example, a polymer material. In other embodiments, the elongated portion 22 of each fastener 16 may be electrically conductive and may include, for example, a metal or a metal alloy material. Furthermore, the metal material may include a plurality of individual layers or coatings of metal material.

Each fastener 16 may further include an integral end piece 24 integrally formed with an end of the elongated portion 22 of each fastener 16. The integral end piece 24 may be disposed at a first end 23A of the elongated portion 22, and the integral end piece 24 may be sized and configured to prevent the integral end piece 24 from passing through the apertures 18 extending through each of the electronic components 12A-12D, and through at least a portion of the apertures 20 extending through the assembly substrate 15.

Each fastener 16 may also include a discrete end piece 26, which may be configured to be securable to an opposite, second end 23B of the elongated portion 22 of each fastener 16. The discrete end piece 26 may also be sized and configured to prevent the discrete end piece 26 from passing through the apertures 18 extending through each of the electronic components 12A-12D, and through at least a portion of the apertures 20 extending through the assembly substrate 15. In some embodiments, the discrete end piece 26 may have an aperture 28 extending therethrough from a first side 27A thereof to a second side 27B thereof. This aperture 28 extending through the discrete end piece 26 may be sized and configured to allow the second end 23B of the elongated portion 22 to slide at least partially through the discrete end piece 26.

In variations that also embody teachings of the present invention, each fastener 16 may include two discrete end pieces 26, one of which may be configured to be securable to the first end 23A of the elongated portion 22 and the other may be configured to be securable to the second end 23B of the elongated portion 22, instead of having an integral end piece 24.

Referring again to FIG. 1B, each aperture 20 extending through the assembly substrate 15 may optionally include an enlarged portion 21 or annular recess configured to receive therein at least a portion of the integral end piece 24 of a fastener 16. In this configuration, the integral end piece 24 of each fastener 16 may be recessed within the assembly substrate 15. In other embodiments, the fasteners 16 may be inverted relative to the semiconductor device assembly 10 such that the integral end piece 24 of each fastener 16 is positioned at the top of the semiconductor device assembly 10 adjacent the fourth electronic component 12D and the discrete end piece 26 is positioned at the bottom of the semiconductor device assembly 10 adjacent the assembly substrate 15.

The integral end piece 24 and the discrete end piece 26 may be secured to the elongated portion 22 in such a manner as to mechanically hold the individual electronic components 12A-12D and the assembly substrate 15 together. Furthermore, the integral end piece 24 and the discrete end piece 26 may be configured and secured to the elongated portion 22 in such a manner as to mechanically hold the individual electronic components 12A-12D and the assembly substrate 15 together in a manner that facilitates electrical communication therebetween.

The discrete end piece 26 may be welded or soldered to the second end 23B of the elongated portion 22 of each fastener 16. By way of example and not limitation, heat may be used to provide a weld between the discrete end piece 26 and the elongated portion 22. In some embodiments, the discrete end piece 26 may be ultrasonically welded to the second end 23B of the elongated portion 22 of each fastener 16, or a laser may be used to weld the discrete end piece 26 to the second end 23B of the elongated portion 22. In other embodiments, an adhesive may be used to secure the discrete end piece 26 to the second end 23B of the elongated portion 22 of each fastener 16. Furthermore, the discrete end piece 26 may comprise a solder ball, which may be formed on the second end 23B of the elongated portion 22. A threaded connection may also be provided between the discrete end piece 26 and the second end 23B of the elongated portion 22.

Figure 3A:
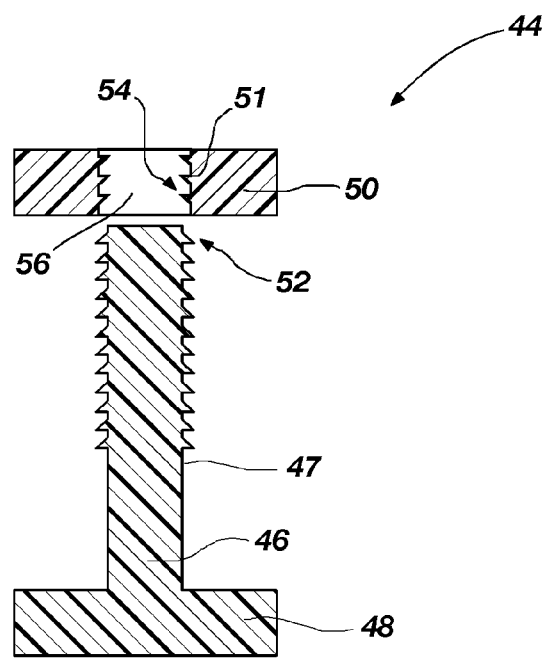
FIG. 3A is a cross-sectional side view of another fastener that may be used in the semiconductor device assembly shown in FIGS. 1A and 1B.

Furthermore, the discrete end piece 26 may be secured to the second end 23B of the elongated portion 22 of each fastener 16 by mechanical interference. A fastener 44 that includes an elongated portion 46, an integral end piece 48, and a discrete end piece 50 that is configured to be securable to an end of the elongated portion 46 by mechanical interference is shown in FIG. 3A. By way of example and not limitation, the elongated portion 46 may have at least one protrusion 52 on a surface 47 thereof, and the discrete end piece 50 may have at least one cooperating protrusion 54 on a surface 51 thereof. For example, a plurality of annular protrusions 52 may extend in a radially outward direction from a lateral surface 47 of the elongated portion 46, and a plurality of cooperating, interfering annular protrusions 54 may extend in a radially inward direction from an interior surface 51 of the discrete end piece 50 within an aperture 56 extending therethrough, as shown in FIG. 3A.

Figure 3B:
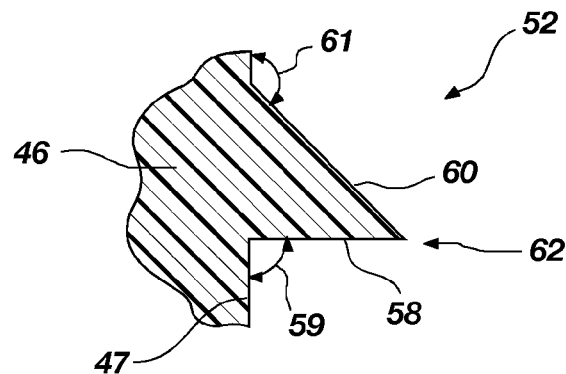
FIGS. 3B and 3C are enlarged partial views of protrusions extending from surfaces of the fastener shown in FIG. 3A.

Referring to FIG. 3B, each protrusion 52 may include, for example, a retention surface 58 and an insertion surface 60. The insertion surface 60 may be configured to facilitate insertion of the elongated portion 46 into the aperture 56 extending through the discrete end piece 50, and the retention surface 58 may be configured to retain the discrete end piece 50 on the elongated portion 46 of the fastener 44 after an end of the elongated portion 46 has been inserted into the aperture 56 extending through the discrete end piece 50. The retention surface 58 may intersect the insertion surface 60 along an edge 62. By way of example and not limitation, the insertion surface 60 may be oriented at an insertion angle 61 relative to an exterior surface 47 of the elongated portion 46 that is greater than ninety degrees (90°), while the retention surface 58 may be oriented at a retention angle 59 relative to the exterior surface 47 of the elongated portion 46 that is equal to or less than ninety degrees (90°).

Figure 3C:
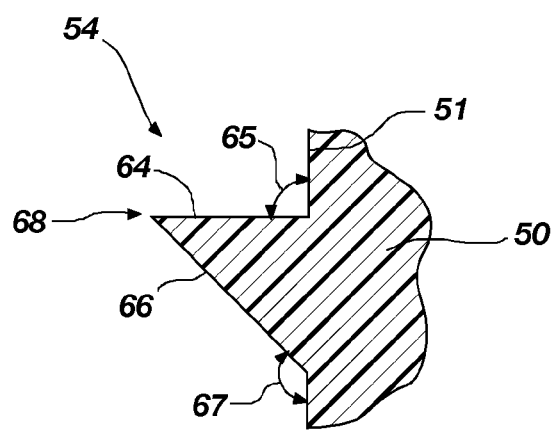

Referring to FIG. 3C, each protrusion 54 of the discrete end piece 50 may also include, for example, a retention surface 64 and an insertion surface 66. The retention surface 64 may intersect the insertion surface 66 along an edge 68. In a manner similar to that described in relation to the protrusion 52 (FIG. 3B), the insertion surface 66 may be oriented at an insertion angle 67 relative to an interior surface 51 of the discrete end piece 50 that is greater than ninety degrees (90°), while the retention surface 64 may be oriented at a retention angle 65 relative to the interior surface 51 of the discrete end piece 50 that is equal to or less than ninety degrees (90°).

Referring again to FIG. 3A, in this configuration, the discrete end piece 50 may be oriented relative to the elongated portion 46 such that when the elongated portion 46 is inserted into the aperture 56 of the discrete end piece 50, the insertion surfaces 66 of the protrusions 54 on the discrete end piece 50 will abut against the insertion surfaces 60 of the protrusions 52 on the elongated portion 46. If sufficient mechanical forces are applied between the discrete end piece 50 and the elongated portion 46, the protrusions 52 and/or the protrusions 54 may slightly deform, allowing the discrete end piece 50 to slide onto the elongated portion 46 and the protrusions 54 to slide past the protrusions 52. The geometry of the protrusions 52 and the protrusions 54, however, may substantially prevent or hinder removal of the discrete end piece 50 from the elongated portion 46. In particular, once the elongated portion 46 of the fastener 44 has been inserted into the aperture 56 of the discrete end piece 50, the retention surfaces 64 of the protrusions 54 may abut against the retention surfaces 58 of the protrusions 52 to substantially prevent or hinder removal of the discrete end piece 50 from the elongated portion 46.

Figure 4:
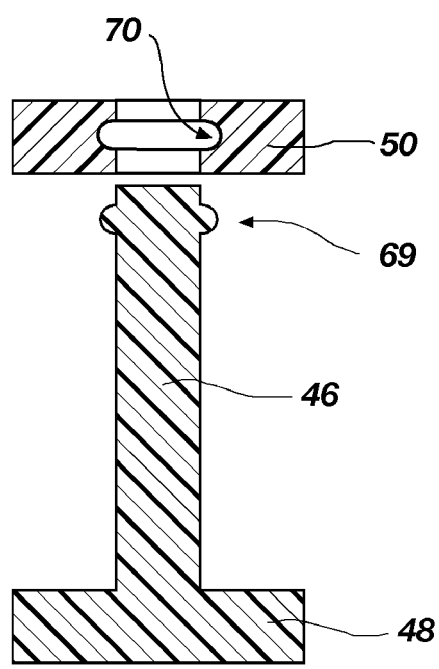
FIG. 4 is a cross-sectional side view of another fastener that may be used in the semiconductor device assembly shown in FIGS. 1A and 1B.

The configuration of the fastener 44 shown in FIGS. 3A-3C is only one example of the manner in which a discrete end piece 50 may be secured to the second end of the elongated portion 46 by mechanical interference. It is understood that there are many other embodiments that are intended to be within the scope of the present invention. By way of example and not limitation, one of the discrete end piece 50 and the elongated portion 46 may include one or more protrusions, and the other of the discrete end piece 50 and the elongated portion 46 may include a cooperating recess in which the protrusion rests when the discrete end piece 50 is provided on the elongated portion 46. Referring to FIG. 4, the elongated portion 46 may include a protrusion 69 and the discrete end piece 50 may include a cooperating recess 70, in which the protrusion 69 is disposed when the discrete end piece 50 is positioned on the elongated portion 46. In such a configuration, a snap-fit may be provided between the discrete end piece 50 and the elongated portion 46.

Referring again to FIG. 1B, by at least partially structurally coupling and securing together the assembly substrate 15 and the electronic components 12A-12D with the fasteners 16 (or with fasteners 44 as shown in FIGS. 3A-3C), electrical connections may not be required along the lateral sides of the semiconductor device assembly 10, thereby allowing the semiconductor device assembly 10 to occupy an area on a higher level substrate (such as, for example, a printed circuit board) that is substantially equal to, or only slightly larger than, the area of each electronic component 12A-12D. While the assembly substrate 15 is shown in FIGS. 1A and 1B to have an area slightly larger than the area of each electronic component 12A-12D, the assembly substrate 15 may have an area substantially equal to the area of each electronic component 12A-12D.

Moreover, by at least partially structurally coupling and securing together the assembly substrate 15 and the electronic components 12A-12D using any of the fasteners previously described herein, replacement of individual electronic components 12A, 12B, 12C, 12D, replacement of the assembly substrate 15, or other re-working procedures may be facilitated. For example, if one or more electronic components 12A-12D is found to be defective during testing after manufacturing the semiconductor device assembly 10, the discrete end piece 26 of each fastener 16 may be cut off, scraped off, or otherwise removed to allow removal of the fasteners 16 and disassembly of the semiconductor device assembly 10. The defective electronic component 12A, 12B, 12C, 12D then may be replaced, and new fasteners 16 may be used to reassemble the components of the semiconductor device assembly 10. Furthermore, the fasteners 16 may serve to align the conductive structures 32 with the conductive structures 34 when the fasteners 16 are inserted through the assembly substrate 15 and the electronic components 12A-12D.

In addition to securing individual electronic components 12A, 12B, 12C, 12D (such as individual semiconductor dice and semiconductor device packages) and assembly substrates 15 together, fasteners that embody teachings of the present invention (such as, for example, the fastener 16 shown in FIG. 2 and the fastener 44 shown in FIGS. 3A-3C) may also be used to attach semiconductor devices together on a so-called "wafer scale." In other words, the electronic components 12A-12D may include two or more substrates with electronic components in or on the substrates (e.g., full or partial semiconductor wafers, silicon-on-insulator (SOI) substrates, and sheets or strips of other types of substrates), and such substrates may be secured together by forming a plurality of apertures through each substrate, aligning the apertures with one another, inserting a portion of a fastener through a hole in each substrate, and attaching a discrete end piece to the portion to structurally couple and secure the substrates together. The stack of structurally coupled substrates may then be diced to form a plurality of stacks of structurally coupled electronic components.

Figure 5:
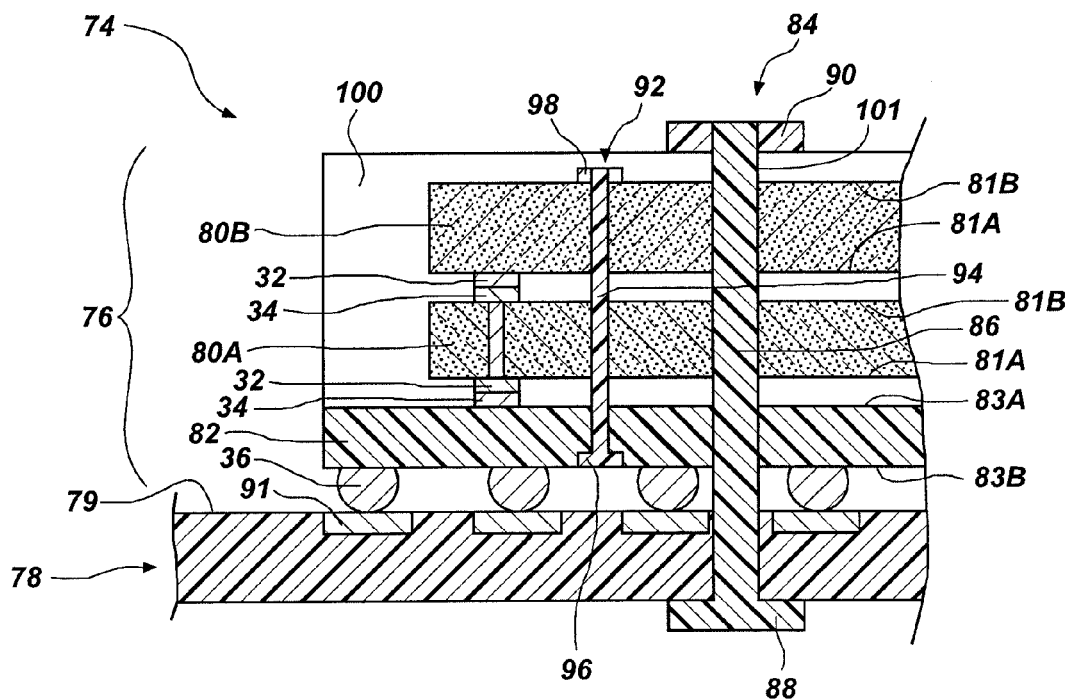
FIG. 5 is a partial cross-sectional side view of another illustrative semiconductor device assembly that includes a first plurality of dielectric fasteners securing together components of a multi-chip module, and a second plurality of dielectric fasteners securing the multi-chip module to a higher level substrate according to teachings of the present invention.

Another illustrative semiconductor device assembly 74 that also embodies teachings of the present invention is shown in FIG. 5. The semiconductor device assembly 74 includes two structures 76, 78 fastened together with a plurality of fasteners 84 in accordance with teachings of the present invention. In particular, the semiconductor device assembly 74 includes a multi-chip module 76 attached to a higher level substrate 78. By way of example and not limitation, the higher level substrate 78 may include a motherboard or a daughterboard of a computer system. Moreover, the multi-chip module 76 also includes a plurality of individual electronic components 80A, 80B fastened together with a plurality of fasteners 92 in accordance with teachings of the present invention. As shown in FIG. 5, the multi-chip module 76 may include a first semiconductor die 80A and a second semiconductor die 80B, which may be structurally and electrically coupled to one another and to a module substrate 82 (which may include, for example, a circuit board). The second semiconductor die 80B may be mounted vertically above the first semiconductor die 80A, as shown in FIG. 5.

The semiconductor device assembly 74 may include a plurality of assembly fasteners 84 used to at least partially structurally couple and secure together the multi-chip module 76 and the higher level substrate 78. Each assembly fastener 84 may include an elongated portion 86, an integral end piece 88, and a discrete end piece 90. The assembly fasteners 84 may be substantially similar to any of the fasteners previously described herein.

The semiconductor device assembly 74 may further include a plurality of module fasteners 92 used to at least partially structurally couple and secure together the module substrate 82 and the semiconductor device 80A, 80B. Each module fastener 92 may also include an elongated portion 94, an integral end piece 96, and a discrete end piece 98. The module fasteners 92 may also be substantially similar to any of the fasteners previously described herein.

Each semiconductor die 80A, 80B may include an active surface 81A on or in which the integrated circuit of the respective semiconductor die 80A, 80B is formed. In the embodiment shown in FIG. 5, the active surface 81A of each semiconductor die 80A, 80B faces downward. The active surface 81A of each semiconductor die 80A, 80B may face upward, or the active surface 81A of one semiconductor die 80A, 80B may face upward while the active surface 81A of the other semiconductor die 80A, 80B faces downward.

A plurality of conductive structures 32 such as, for example, bond pads and/or conductive balls, bumps, studs, columns, pillars, posts or lands of metal, alloy (including, without limitation, solder) or other conductive or conductor-filled or coated material may be provided on or in an active surface 81A of each semiconductor die 80A, 80B. The conductive structures 32 may be disposed in a selected connection pattern. By way of example and not limitation, the conductive structures 32 may be disposed in a so-called "ball-grid-array" (BGA) connection pattern on or in an active surface 81A of each semiconductor die 80A, 80B. A plurality of conductive structures 34 such as, for example, conductive terminals, may be provided on or in the back surface 81B of the first semiconductor die 80A and on a first surface 83A of the module substrate 82. Each semiconductor die 80A, 80B and the module substrate 82 may further include generally horizontally extending conductive traces (not shown) and generally vertically extending conductive vias (not shown) for providing electrical communication between the electrical components of the integrated circuits (not shown) of each semiconductor die 80A, 80B and electrically conductive structures 36 on or in a second surface 83B of the module substrate 82, through the electrically conductive structures 32 and the conductive structures 34. The electrically conductive structures 36 on the second surface 83B of the module substrate 82 may be configured for electrically coupling the multi-chip module 76 to the higher level substrate 78.

An encapsulant material 100 may optionally be provided over the semiconductor dice 80A, 80B of the multi-chip module 76 to provide structural rigidity and to provide protection to the semiconductor dice 80A, 80B from moisture or contaminants. The encapsulant material 100 also may include apertures 101 configured to receive the assembly fasteners 84 to facilitate securing the multi-chip module 76 to the higher level substrate 78.

Optionally, a dielectric underfill material (not shown) that is distinct from the encapsulant material 100 may be provided between the first semiconductor die 80A and the second semiconductor die 80B, and/or between the first semiconductor die 80A and the module substrate 82, as previously discussed in relation to the semiconductor device assembly 10 shown in FIG. 1.

With continued reference to FIG. 5, the module fasteners 92 may be used to align the conductive structures 32 with the conductive structures 34 during assembly, and the assembly fasteners 84 may be used to align the electrically conductive structures 36 with conductive structures 91 in or on a surface 79 of the higher level substrate 78. Furthermore, the higher level substrate 78 may also include generally horizontally extending conductive traces (not shown) and generally vertically extending conductive vias (not shown) for providing electrical communication between the multi-chip module 76 and other electrical components or devices (not shown), which may be attached to the higher level substrate 78.

In this configuration, re-working procedures of both the semiconductor device assembly 74 and the multi-chip module 76 may be facilitated. For example, if it is desired to re-work the semiconductor device assembly 74 to, for example, replace or re-work the multi-chip module 76, the discrete end piece 90 of each fastener 84 may be cut off, scraped off, or otherwise removed to allow removal of the fasteners 84 and disassembly of the semiconductor device assembly 74. The multi-chip module 76 may then be replaced, and new fasteners 84 may be used to re-assemble the semiconductor device assembly 74. In addition, if it is desired to re-work the multi-chip module 76 to, for example, replace one or both of the semiconductor dice 80A, 80B, the discrete end piece 98 of each fastener 92 may be cut off, scraped off, or otherwise removed to allow removal of the fasteners 92 and disassembly of the multi-chip module 76. If the semiconductor device assembly 74 includes an encapsulant material 100, a portion of the encapsulant material 100 may be removed proximate the discrete end piece 98 of each fastener 92 to facilitate removal thereof. New fasteners 92 then may be used to re-assemble the multi-chip module 76.

Figure 6:
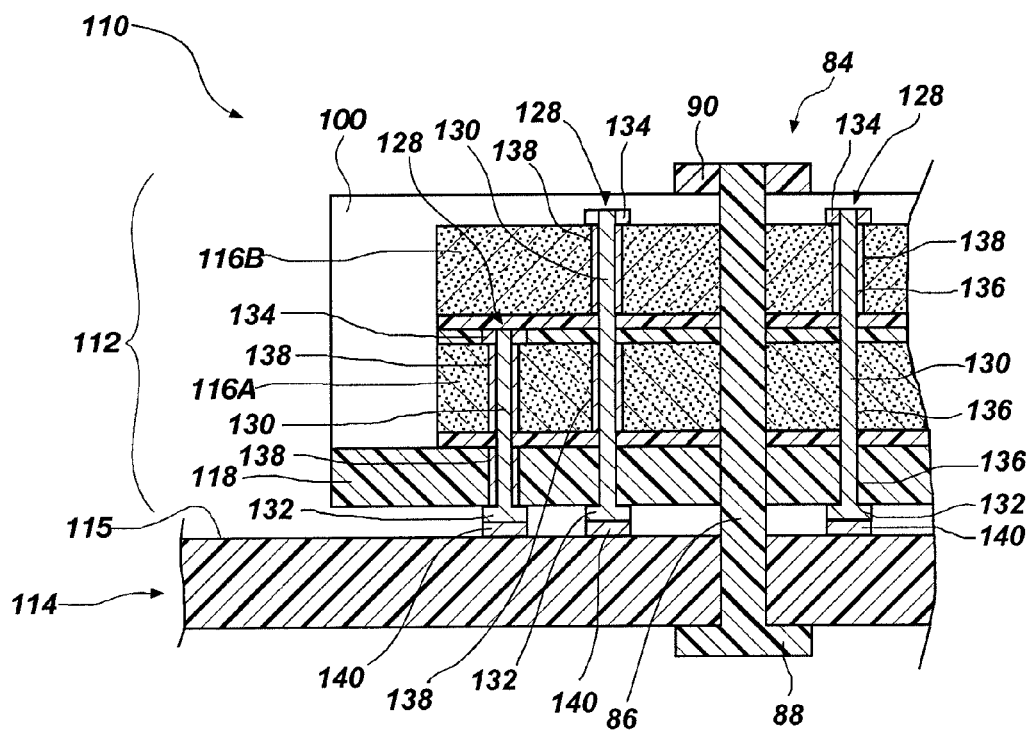
FIG. 6 is a partial cross-sectional side view of yet another illustrative semiconductor device assembly that includes a first plurality of dielectric fasteners according to teachings of the present invention, and a plurality of conductive fasteners according to teachings of the present invention.

Another illustrative semiconductor device assembly 110 that also embodies teachings of the present invention is shown in FIG. 6. The semiconductor device assembly 110 includes a multi-chip module 112 attached to a higher level substrate 114 such as, for example, a motherboard or daughterboard of a computer system. The semiconductor device assembly 110 also may include conductive fasteners 128, described in further detail below, which may be configured to provide electrical communication between the multi-chip module 112 and the higher level substrate 114, and/or between individual electronic components 116A, 116B of the multi-chip module 112.

As shown in FIG. 6, the multi-chip module 112 may include a first semiconductor die 116A structurally and electrically coupled to a module substrate 118 (which may include, for example, a circuit board), and a second semiconductor die 116B that is mounted vertically above and structurally and electrically coupled to the first semiconductor die 116A.

The semiconductor device assembly 110 may include a plurality of assembly fasteners 84 (as previously described in relation to FIG. 5) used to at least partially structurally couple and secure together the multi-chip module 112 and the higher level substrate 114. Each assembly fastener 84 may include an elongated portion 86, an integral end piece 88, and a discrete end piece 90. The assembly fasteners 84 may be substantially similar to any of the fasteners previously described herein.

The semiconductor device assembly 110 may further include a plurality of electrically conductive module fasteners 128 used to at least partially structurally couple and secure together the module substrate 118 and the semiconductor dice 116A, 116B. Each module fastener 128 may also include an elongated portion 130, an integral end piece 132, and a discrete end piece 134. The module fasteners 128 may have a size and shape configured to be substantially similar to the fasteners 16 previously described in relation to FIG. 2, or they may be configured substantially similar to the fasteners 44 previously described in relation to FIGS. 3A-3C. The module fasteners 128, however, may comprise an electrically conductive material such as, for example, copper, gold, aluminum or alloys thereof.

Each of the first semiconductor die 116A, the second semiconductor die 116B, and the module substrate 118 may include a plurality of apertures 136 through which the elongated portion 130 of the module fasteners 128 extend. At least some of these apertures 136 may be formed through an electrically conductive via 138, as shown in FIG. 6. The electrically conductive vias 138 extending through the semiconductor dice 116A, 116B may electrically communicate with one or more components (such as a transistor) of the integrated circuits (not shown) contained within the semiconductor dice 116A, 116B, while the electrically conductive vias 138 extending through the module substrate 118 may electrically communicate with one or more conductive traces (not shown) to other electrically conductive structures in or on the module substrate 118. In this configuration, electrical communication may be provided between the electrically conductive vias 138 and the electrically conductive module fasteners 128.

The integral end pieces 132 of the electrically conductive module fasteners 128 may provide electrical contacts or terminals, which may be aligned with and electrically coupled to electrically conductive structures 140 provided on or in a surface 115 of the higher level substrate 114. In this configuration, electrical communication may be provided between the components (such as a transistors) of the integrated circuits (not shown) contained within the semiconductor dice 116A, 116B and other electrical components or devices (not shown), which may be attached to the higher level substrate 114 through the conductive vias 138, the electrically conductive module fasteners 128, the electrically conductive structures 140, and other electrically conductive traces or vias (not shown) on or in the higher level substrate 114.

An encapsulant material 100 may optionally be provided over the semiconductor dice 116A, 116B of the multi-chip module 112 to provide structural rigidity and to provide protection to the semiconductor dice 116A, 116B from moisture, contaminants, static electricity, etc.

The module fasteners 128 may be used to align the semiconductor dice 116A, 116B and the module substrate 118 during assembly (in addition to securing the semiconductor dice 116A, 116B and the module substrate 118 together and providing electrical communication between the semiconductor dice 116A, 116B and the higher level substrate 114), and the assembly fasteners 84 may be used to align the integral end pieces 132 of the module fasteners 128 with the conductive structures 140 in or on the surface 115 of the higher level substrate 114 during assembly (in addition to securing together the multi-chip module 112 and the higher level substrate 114).

Figure 8:
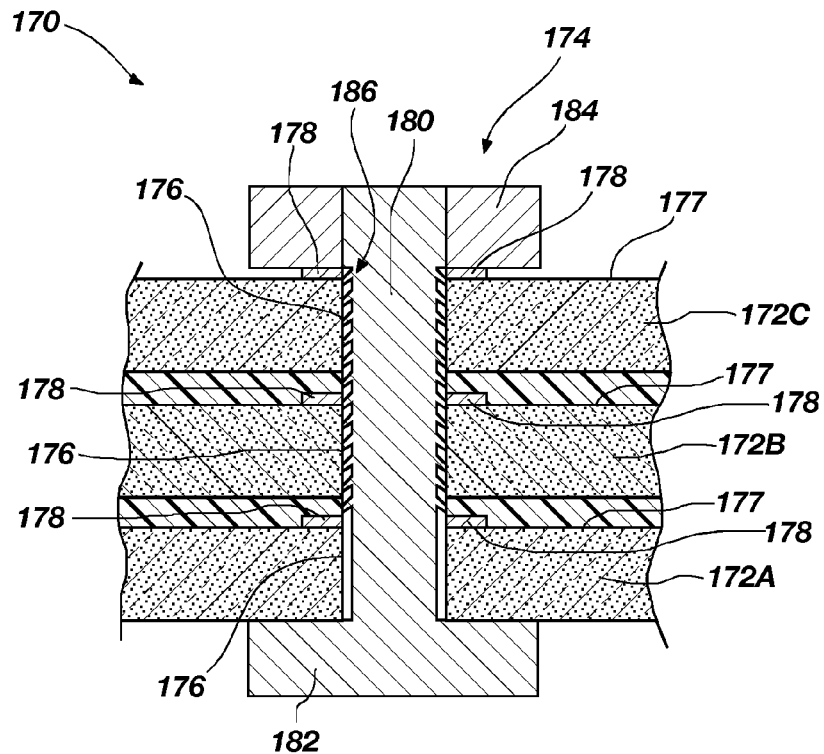
FIG. 8 is a partial cross-sectional side view of a portion of still another illustrative semiconductor device assembly that includes a conductive fastener according to teachings of the present invention.
Figure 7:
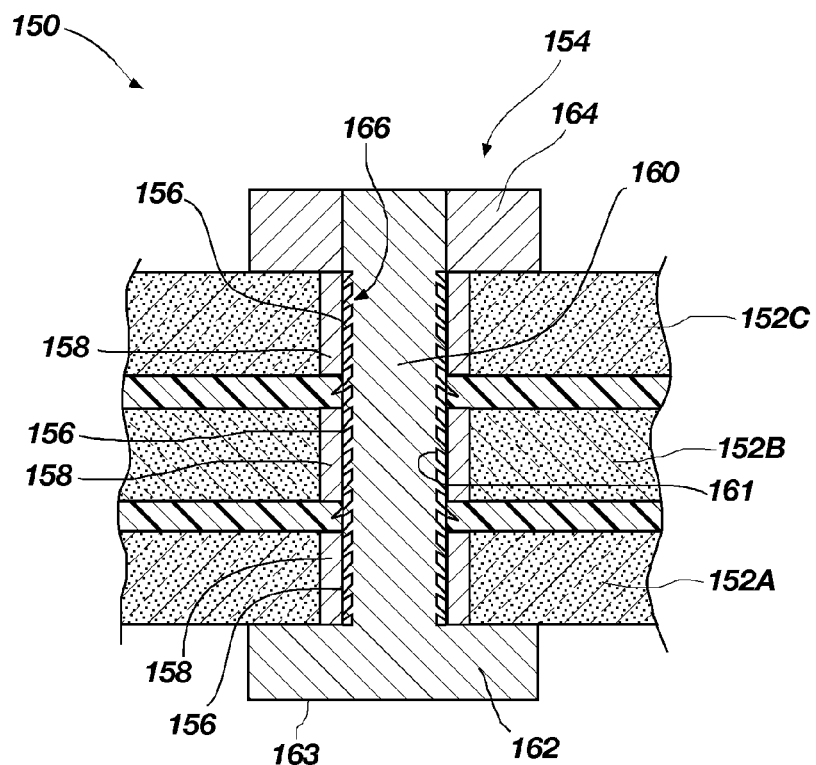
FIG. 7 is a partial cross-sectional side view of a portion of another illustrative semiconductor device assembly that includes a conductive fastener according to teachings of the present invention.

FIGS. 7 and 8 illustrate different configurations of fasteners and methods of establishing electrical communication between an electrically conductive fastener and electrically conductive elements or features of a semiconductor die or other electrical component.

A portion of another illustrative semiconductor device assembly 150 is shown in FIG. 7. The semiconductor device assembly 150 may include a first semiconductor die 152A, a second semiconductor die 152B, and a third semiconductor die 152C secured together by at least one electrically conductive fastener 154. Each of the semiconductor dice 152A-152C may include at least one aperture 156 formed through a conductive via 158. By way of example and not limitation, each conductive via 158 may include a substantially cylindrical region of an electrically conductive material (such as, for example, gold, copper, or aluminum) before each aperture 156 is formed therethrough. Each aperture 156 may also be substantially cylindrical. In other embodiments, each aperture 156 and each conductive via 158 may have any other shape.

The at least one electrically conductive fastener 154 may include an elongated portion 160, an integral end piece 162, and a discrete end piece 164. A plurality of radially outwardly extending protrusions, barbs, or spikes 166 may be provided on a lateral surface 161 of the elongated portion 160 of the conductive fastener 154. These spikes 166 may be integrally formed with the elongated portion 160 and may also be electrically conductive. In this configuration, as the elongated portion 160 is inserted through the apertures 156 in the conductive vias 158 of the semiconductor dice 152A-152C, the electrically conductive spikes 166 may abut against and engage the conductive vias 158 of the semiconductor dice 152A-152C, thereby establishing electrical communication between the conductive vias 158 and the elongated portion 160 through the spikes 166.

In other embodiments, the spikes 166 may be replaced with simple protrusions formed by, for example, roughening the outer lateral surface 161 of the elongated portion 160 of the fastener 154 using, for example, an etchant. In such a configuration, the outer lateral surface 161 of the elongated portion 160 may be characterized by a plurality of randomly shaped protrusions and recesses (not shown). The protrusions may be configured to abut against and engage the conductive vias 158 of the semiconductor dice 152A-152C.

Moreover, the integral end piece 162 and/or the discrete end piece 164 of the fastener 154 may be configured and used as a conductive terminal for establishing electrical communication between integrated circuits contained within the individual semiconductor dice 152A-152C of the semiconductor device assembly 150 and a higher level substrate (such as a circuit board). Optionally, solder balls or other conductive or conductor-filled or coated bumps, studs, columns, pillars, posts or lands, or any other electrically conductive structure may be provided on the exposed surface 163 of the integral end piece 162 and used to facilitate electrical coupling of the fastener 154 to a higher level substrate (not shown).

A portion of yet another illustrative semiconductor device assembly 170 is shown in FIG. 8. The semiconductor device assembly 170 may include a first semiconductor die 172A, a second semiconductor die 172B, and a third semiconductor die 172C secured together by at least one electrically conductive fastener 174. Each of the semiconductor dice 172A-172C may include at least one aperture 176 formed therethrough. By way of example and not limitation, each aperture 176 may be substantially cylindrical. In other embodiments, each aperture 176 may have any other shape. Each of the semiconductor dice 172A-172C may include an active surface 177.

Each of the semiconductor dice 172A-172C may include at least one conductive terminal or pad 178 formed on or in an active surface 177 thereof adjacent the apertures 176 extending through the semiconductor dice 172A-172C. In one particular embodiment, each conductive terminal or pad 178 may be substantially circular and each aperture 176 may be formed in and extend through the circular terminals or pads 178. In other embodiments, the conductive terminals or pads 178 may have a substantially rectangular shape or any other shape and may be disposed laterally adjacent each aperture 176.

The at least one electrically conductive fastener 174 may be substantially identical to the fastener 154 previously described in relation to FIG. 7, and may include an elongated portion 180, an integral end piece 182, and a discrete end piece 184. The fastener 174 may further include a plurality of radially outwardly extending protrusions, barbs, or spikes 186, which may be substantially identical to the spikes 166 also previously described in relation to FIG. 7. In this configuration, as the elongated portion 180 is inserted through the apertures 176 of the semiconductor dice 172A-172C, the electrically conductive spikes 186 may abut against and engage the conductive terminals or pads 178 disposed on the active surfaces 177 of the semiconductor dice 172A-172C, thereby establishing electrical communication between the terminals or pads 178 and the elongated portion 180 through the spikes 186. Furthermore, the discrete end piece 184 may abut against and communicate electrically with at least one terminal or pad 178 disposed on the active surface 177 of the third semiconductor die 172C, as shown in FIG. 8.

In this configuration, the integral end piece 182 and/or the discrete end piece 184 of the fastener 174 may be configured and used as a conductive terminal for establishing electrical communication between integrated circuits contained within the individual semiconductor dice 172A-172C of the semiconductor device assembly 170 and a higher level substrate (such as a circuit board).

Semiconductor device assemblies that embody teachings of the present invention may also include semiconductor dice stacked in an offset configuration relative to one another and fastened together using fasteners that embody teachings of the present invention.

Figure 9:
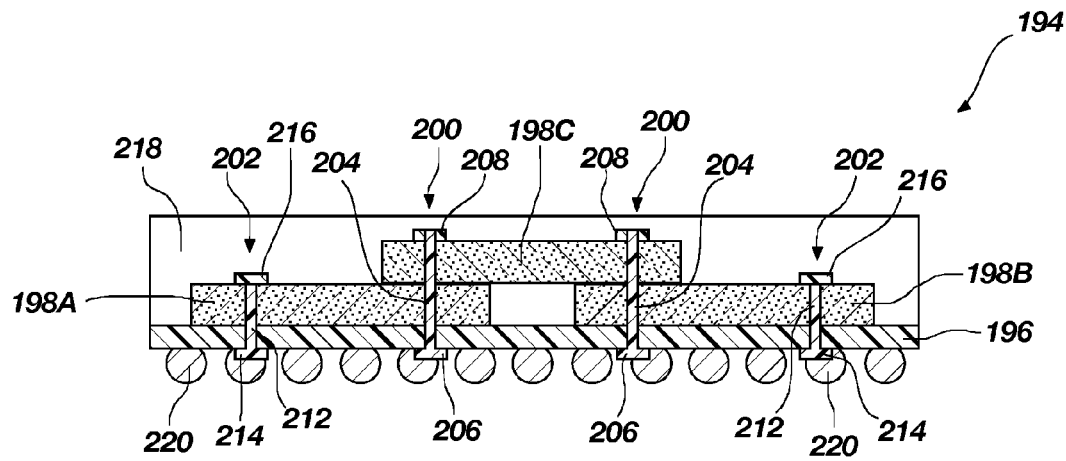
FIG. 9 is a cross-sectional side view of another illustrative semiconductor device assembly that includes overlapping semiconductor dice secured together and to an underlying substrate using fasteners according to teachings of the present invention.

Another illustrative semiconductor device assembly 194 that embodies teachings of the present invention is shown in FIG. 9. The semiconductor device assembly 194 includes a multi-chip module, which may include a package or assembly substrate 196, a first semiconductor die 198A, a second semiconductor die 198B, and a third semiconductor die 198C. In other embodiments, the semiconductor device assembly 194 may include more than three or less than three semiconductor dice. The first semiconductor die 198A and the second semiconductor die 198B each may be mounted on and structurally and electrically coupled directly to the assembly substrate 196. The third semiconductor die 198C may be mounted over and structurally coupled to both the first semiconductor die 198A and the second semiconductor die 198B, as shown in FIG. 9. The semiconductor device assembly 194 may optionally include a dielectric encapsulant material 218 (such as, for example, an epoxy-based material) substantially encapsulating the semiconductor dice 198A-198C.

A plurality of relatively long fasteners 200 and a plurality of relatively short fasteners 202 may be used to at least partially structurally couple the semiconductor dice 198A-198C to the assembly substrate 196. The long fasteners 200 each may include an elongated portion 204 that extends through an aperture extending through the assembly substrate 196, an aperture extending through one of the first semiconductor die 198A and the second semiconductor die 198B, and an aperture extending through the third semiconductor die 198C. The long fasteners 200 may also include an integral end piece 206 and a discrete end piece 208. The short fasteners 202 each may include an elongated portion 212 that extends through an aperture extending through the assembly substrate 196, and through an aperture extending through one of the first semiconductor die 198A and the second semiconductor die 198B. The short fasteners 202 may also include an integral end piece 214 and a discrete end piece 216.

The long fasteners 200 and the short fasteners 202 may be electrically non-conductive and merely used to structurally couple the semiconductor dice 198A-198C to the assembly substrate 196, and to align corresponding electrically conductive structures (not shown) on the semiconductor dice 198A-198C and the assembly substrate 196, as previously discussed herein. In other embodiments, at least some of the long fasteners 200 and the short fasteners 202 may be electrically conductive and used to provide electrical communication between components (such as transistors) of the integrated circuits (not shown) contained within the semiconductor dice 198A-198C and electrically conductive structures 220 (such as, for example, solder balls or conductor-filled epoxy bumps) disposed on the assembly substrate 196 and configured to communicate electrically with conductive structures on a higher level substrate (such as, for example, a motherboard of a computer system) (not shown).

Each of the multi-chip modules previously described herein includes electrical contacts arranged in a selected electrical connection pattern such as, for example, a ball-grid-array (BGA) pattern. Multi-chip modules that include other types or configurations of semiconductor dice are also encompassed by the present invention.

Figure 10:
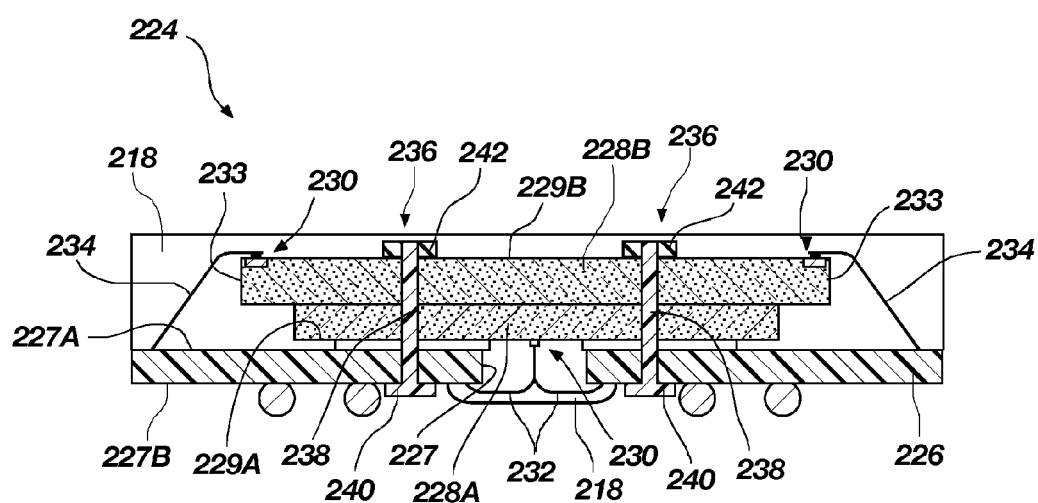
FIG. 10 is a cross-sectional side view of yet another illustrative semiconductor device assembly that includes semiconductor dice secured together and to an underlying substrate using fasteners according to teachings of the present invention.

Another illustrative semiconductor device assembly 224 that embodies teachings of the present invention is shown in FIG. 10. The semiconductor device assembly 224 includes a multi-chip module, which may include a package or assembly substrate 226, a first semiconductor die 228A, and a second semiconductor die 228B. The first semiconductor die 228A and the second semiconductor die 228B may be stacked in a back-to-back configuration in which an active surface 229A of the first semiconductor die 228A faces downward and an active surface 229B of the second semiconductor die 228B faces upward.

The first semiconductor die 228A may include a plurality of bond pads 230 disposed on the active surface 229A thereof, the active surface 229A being disposed adjacent an upper surface 227A of the assembly substrate 226. The bond pads 230 may be positioned substantially along a centerline (not shown) of the first semiconductor die 228A and aligned with an aperture 227 extending through the assembly substrate 226. Wire bonds 232 may extend through the aperture 227 in the assembly substrate 226 between the bond pads 230 and conductive structures (not shown) disposed on a lower surface 227B of the assembly substrate 226 opposite the first semiconductor die 228A, thereby providing electrical communication between the first semiconductor die 228A and the assembly substrate 226.

The second semiconductor die 228B may include a plurality of bond pads 230 disposed on the active surface 229B thereof. The bond pads 230 may be positioned substantially along at least two lateral edges 233 of the second semiconductor die 228B. The bond pads 230 of the second semiconductor die 228B may be electrically coupled to conductive structures (not shown) disposed on the upper surface 227A of the assembly substrate 226 using tape-automated bonding (TAB) techniques, in which patterned conductive traces and terminals (not shown) are carried on a tape material 234. The tape material 234, together with the conductive traces and terminals, is aligned with and applied to the semiconductor device assembly 224 such that electrical communication is established between the bond pads 230 of the second semiconductor die 228B and the conductive structures of the assembly substrate 226 through the conductive traces and terminals carried by the tape material 234.

A plurality of fasteners 236, which may be substantially identical to any of those previously described herein, may be used to at least partially structurally couple and secure together the first semiconductor die 228A, the second semiconductor die 228B, and the assembly substrate 226. The fasteners 236 may each include an elongated portion 238 that extends through an aperture extending through the assembly substrate 226, an aperture extending through the first semiconductor die 228A, and an aperture extending through the second semiconductor die 228B. The fasteners 236 may also include an integral end piece 240 and a discrete end piece 242.

The semiconductor device assembly 224 may optionally include a dielectric encapsulant material 218 substantially encapsulating the semiconductor dice 228A and 228B and the wire bonds 232.

Figure 11A:
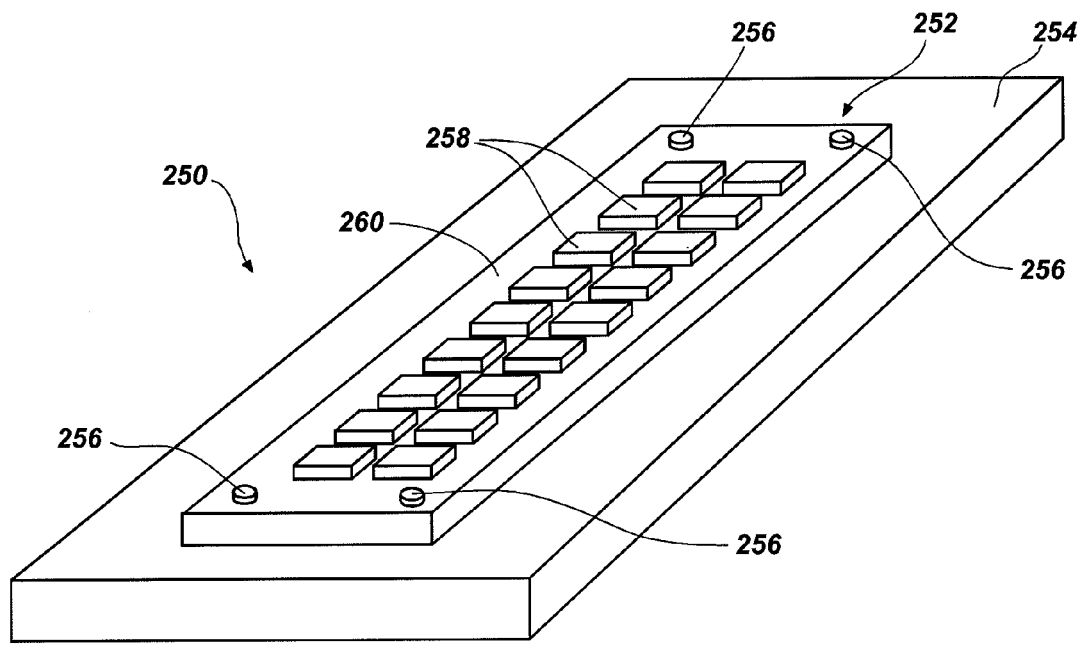
FIG. 11A is a perspective view of another illustrative semiconductor device assembly that includes a memory module secured to a higher level substrate using fasteners according to teachings of the present invention.
Figure 11B:
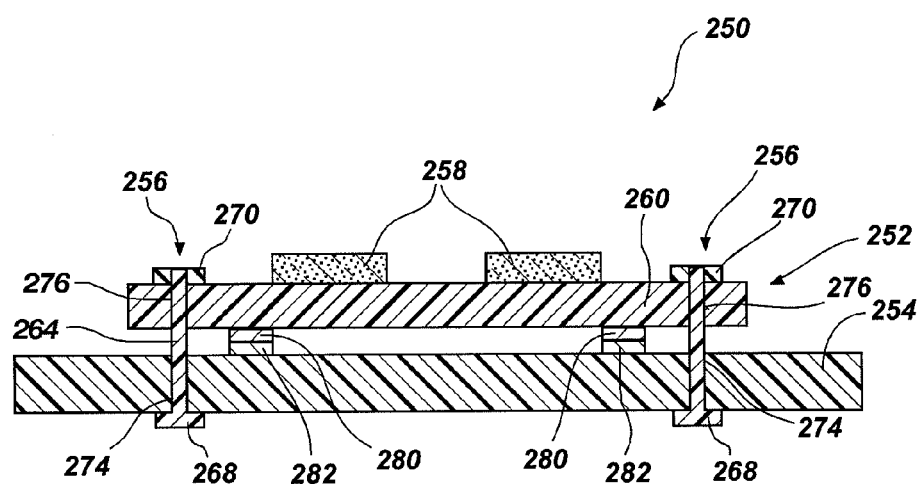
FIG. 11B is a cross-sectional side view of the semiconductor device assembly shown in FIG. 11A.

Another illustrative semiconductor device assembly 250 that embodies teachings of the present invention is shown in FIGS. 11A and 11B. The semiconductor device assembly 250 may include a semiconductor device module 252 that is structurally coupled and secured to a higher level substrate 254 using a plurality of fasteners 256 that embody teachings of the present invention. The semiconductor device module 252 may include at least one semiconductor die 258 structurally and electrically coupled to a module substrate 260. As shown in FIG. 11A, the semiconductor device module 252 may include a plurality of semiconductor dice 258. By way of example and not limitation, the semiconductor device module 252 may comprise a volatile-type memory module such as, for example, a dynamic random access memory (DRAM) module or a static random access memory (SRAM) module, or the semiconductor device module 252 may comprise a nonvolatile-type memory module such as, for example, a flash memory module. In other embodiments, the semiconductor device module 252 may comprise a microprocessor device module including a processor die, one or more logic dice and one or more memory dice. In addition, the semiconductor device module 252 may include other combinations of mutually differing semiconductor dice 258, such as a CMOS (complementary metal oxide semiconductor) imager die stacked on top of one or more memory dice. Furthermore, the higher level substrate 254 may include, for example, a circuit board such as a motherboard for a computer system.

FIG. 11B is a cross-sectional view of the semiconductor device assembly 250 shown in FIG. 11A. As seen therein, each fastener 256 may include an elongated portion 264 that extends continuously through an aperture 274 formed in the higher level substrate 254 and through an aperture 276 formed in the module substrate 260. Each fastener 256 may further include an integral end piece 268 and a discrete end piece 270, both of which may be sized and configured to prevent passage thereof through the apertures 274 and the apertures 276. The fasteners 256 may be used to align conductive structures 280 provided on or in a lower surface of the module substrate 260 with conductive structures 282 provided on or in a surface of the higher level substrate 254. In this configuration, when the semiconductor device module 252 is oriented relative to the higher level substrate 254 such that the apertures 276 are aligned with the apertures 274, and the semiconductor device module 252 is structurally coupled and secured to the higher level substrate 254 using the fasteners 256, electrical communication is established between the conductive structures 280 and the conductive structures 282. The module substrate 260 and the higher level substrate 254 each may further include generally horizontally extending conductive traces (not shown) and generally vertically extending conductive vias (not shown), which may be used to provide electrical communication between the conductive structures 280 and the semiconductor dice 258 and between the conductive structures 282 and other electrical components or devices (not shown) that may also be attached to the higher level substrate 254.

The fasteners 256 used to secure the semiconductor device module 252 to the higher level substrate 254 may be substantially identical to any of the fasteners previously described herein. Furthermore, while not shown, each of the semiconductor dice 258 may be structurally and electrically coupled to the module substrate 260 using fasteners as previously described herein that embody teachings of the present invention.

By providing semiconductor device modules (such as memory modules and microprocessor modules) and higher level substrates (such as circuit boards) that embody teachings of the present invention and include corresponding arrays of apertures configured to receive fasteners as described herein, semiconductor device modules may be easily and removably secured and coupled to higher level substrates, which may eliminate the need for industry standard sockets such as, for example, single inline memory module (SIMM) sockets and dual inline memory module (DIMM) sockets.

Figure 12:
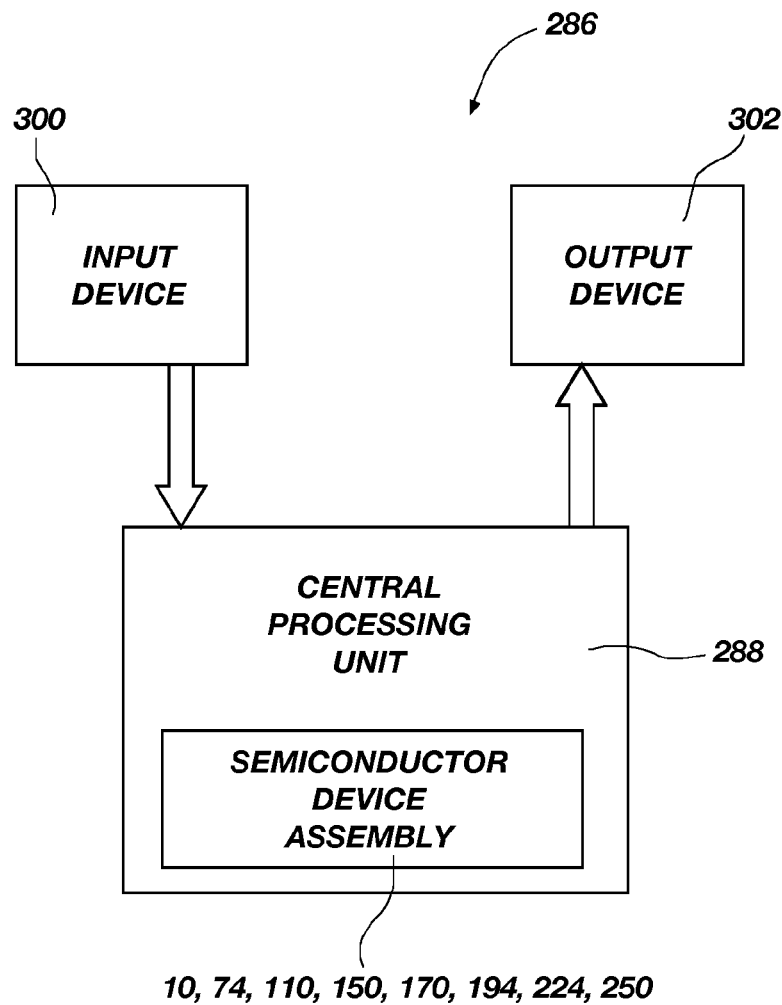
FIG. 12 is a block diagram of an illustrative computer system that embodies teachings of the present invention.

An illustrative computer system 286 that embodies teachings of the present invention is shown in FIG. 12. The computer system 286 may include a central processing unit 288 including at least one processor device and at least one memory device. The central processing unit 288 includes a semiconductor device assembly as previously described herein, which may comprise at least one of the processor device and the memory device.

By way of example and not limitation, the semiconductor device assembly may include one or more of the semiconductor device assembly 10 previously described in relation to FIGS. 1A and 1B, the semiconductor device assembly 74 previously described in relation to FIG. 5, the semiconductor device assembly 110 previously described in relation to FIG. 6, the semiconductor device assembly 150 previously described in relation to FIG. 7, the semiconductor device assembly 170 previously described in relation to FIG. 8, the semiconductor device assembly 194 previously described in relation to FIG. 9, the semiconductor device assembly 224 previously described in relation to FIG. 10, or the semiconductor device assembly 250 previously described in relation to FIGS. 11A and 11B, or another semiconductor device assembly that embodies teachings of the present invention.

The computer system 286 may further include at least one input device 300 (such as, for example, a keyboard, a mouse or other pointer device, or a control panel) and at least one output device 302 (such as, for example, a monitor or a printer). Furthermore, two or more of the central processing unit 288, the input device 300, and the output device 302 may be incorporated into a single structural unit, or they may be formed as separate structural units and coupled together using electrical wires or wireless technology.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims which follow.

What is claimed is:

1. A method for securing together a plurality of semiconductor devices comprising:
   providing a first semiconductor device having at least one aperture extending therethrough;
   providing at least one additional semiconductor device having at least one aperture extending therethrough;
   providing at least one fastener comprising an elongated portion;
   inserting the elongated portion of the at least one fastener through the at least one aperture extending through the first semiconductor device and the at least one aperture extending through the at least one additional semiconductor device; and
   securing at least one discrete end piece to the elongated portion of the at least one fastener by at least one of a weld and a press fit, the discrete end piece sized and configured to prevent the discrete end piece from passing through the at least one aperture extending through the first semiconductor device and the at least one aperture extending through the at least one additional semiconductor device.

2. The method of claim 1, wherein providing a first semiconductor device comprises providing a first semiconductor device package, and wherein providing at least one additional semiconductor device comprises providing at least one additional semiconductor device package.

3. The method of claim 2, wherein providing a first semiconductor device comprises providing a first semiconductor device and forming at least one aperture extending through the first semiconductor device, and wherein providing at least one additional semiconductor device comprises providing at least one additional semiconductor device and forming at least one aperture extending through the at least one additional semiconductor device.

4. The method of claim 1, further comprising aligning the at least one aperture extending through the at least one additional semiconductor device with the at least one aperture extending through the first semiconductor device.

5. The method of claim 1, wherein providing at least one fastener comprising an elongated portion comprises providing at least one fastener comprising an electrically conductive elongated portion.

6. The method of claim 5, further comprising providing electrical contact between the first semiconductor device and the at least one additional semiconductor device through the elongated portion of the at least one fastener.

7. The method of claim 1, wherein providing at least one fastener comprising an elongated portion comprises providing at least one fastener comprising an elongated portion that is electrically nonconductive.

8. The method of claim 1, wherein providing at least one fastener comprising an elongated portion comprises providing at least one fastener comprising an integral end piece integrally formed with the elongated portion, the integral end piece being disposed at an end of the elongated portion and sized and configured to prevent the integral end piece from passing through the at least one aperture extending through the first semiconductor device and the at least one aperture extending through the at least one additional semiconductor device.

9. The method of claim 1, wherein securing at least one discrete end piece to the elongated portion of the at least one fastener by at least one of a weld and a press fit comprises securing a discrete end piece to the elongated portion of the at least one fastener, the discrete end piece sized and configured to prevent the discrete end piece from passing through the at least one aperture extending through the first semiconductor device and the at least one aperture extending through the at least one additional semiconductor device.

10. The method of claim 9, further comprising forming the discrete end piece on an end of the elongated portion of the at least one fastener.

11. The method of claim 9, wherein providing at least one fastener comprises providing at least one fastener having at least one protrusion extending from a surface thereof, and wherein providing a discrete end piece comprises providing a discrete end piece having at least one protrusion extending from a surface thereof, and wherein securing the discrete end piece to an end of the elongated portion of the at least one fastener comprises positioning the discrete end piece on the end of the elongated portion, mechanical interference between the at least one protrusion extending from the at least one fastener and the at least one protrusion extending from the discrete end piece at least partially securing the discrete end piece to the elongated portion of the at least one fastener.

12. The method of claim 1, further comprising providing an assembly substrate comprising a plurality of electrically conductive structures disposed on a surface thereof, the assembly substrate having at least one aperture extending therethrough, and wherein inserting the elongated portion of the at least one fastener through the at least one aperture comprises inserting at least a portion of the elongated portion of the at least one fastener through the at least one aperture in the assembly substrate to at least partially secure the assembly substrate to the first semiconductor device and the at least one additional semiconductor device.

13. The method of claim 1, wherein securing at least one discrete end piece to the elongated portion of the at least one fastener by at least one of a weld and a press fit comprises passing a plurality of annular protrusions on an outside surface of the elongated portion of the at least one fastener through a plurality of mechanically interfering annular protrusions on an inside surface of the at least one discrete end piece.

\* \* \* \* \*